(12) United States Patent
Wei et al.

(10) Patent No.: US 6,369,660 B1
(45) Date of Patent: Apr. 9, 2002

(54) CIRCUIT AND METHOD FOR PREVENTING RUNAWAY IN A PHASE LOCK LOOP

(75) Inventors: Sen-Jung Wei, San Jose; Kuang-Yu Chen, Saratoga, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/428,624

(22) Filed: Oct. 27, 1999

(51) Int. Cl.⁷ .................................................. H03L 7/08
(52) U.S. Cl. ........................... 331/15; 331/17; 331/1 A; 327/156; 327/159
(58) Field of Search .............................. 331/11, 17, 1 A, 331/16; 375/376; 327/156, 159

(56) References Cited

U.S. PATENT DOCUMENTS

| 4,484,152 A | * 11/1984 | Lee ............................... 331/14 |
| 4,996,444 A | 2/1991 | Thomas et al. .............. 327/165 |
| 5,694,087 A | 12/1997 | Ferraiolo et al. ............. 331/11 |
| 5,828,253 A | * 10/1998 | Murayama ................... 327/156 |

OTHER PUBLICATIONS

Nathan Y. Moyal et al., Circuits, Architectures and Methods for Detecting and Correcting Excess Oscillator Frequencies, Serial No. 09/159,908, filed Sep. 24, 1998, now U.S. Patent 6,140,880.

Richard Chou et al., Method, Architecture and Circuit for Controlling and/or Operating an Oscillator, Serial No. 09/320,057, filed May 22, 1999, now U.S. Patent 6177843.

* cited by examiner

*Primary Examiner*—Arnold Kinkead
(74) *Attorney, Agent, or Firm*—Christopher P. Malorana, P.C.

(57) ABSTRACT

A circuit and/or method comprising an oscillator circuit, a pulse detection circuit and a control circuit. The oscillator circuit may be configured to generate an output signal having a frequency in response to (i) a first control signal and (ii) a second control signal. The pulse detection circuit may be configured to generate a detect signal in response to the output signal. The control circuit may be configured to generate the second control signal in response to said detect signal.

14 Claims, 5 Drawing Sheets

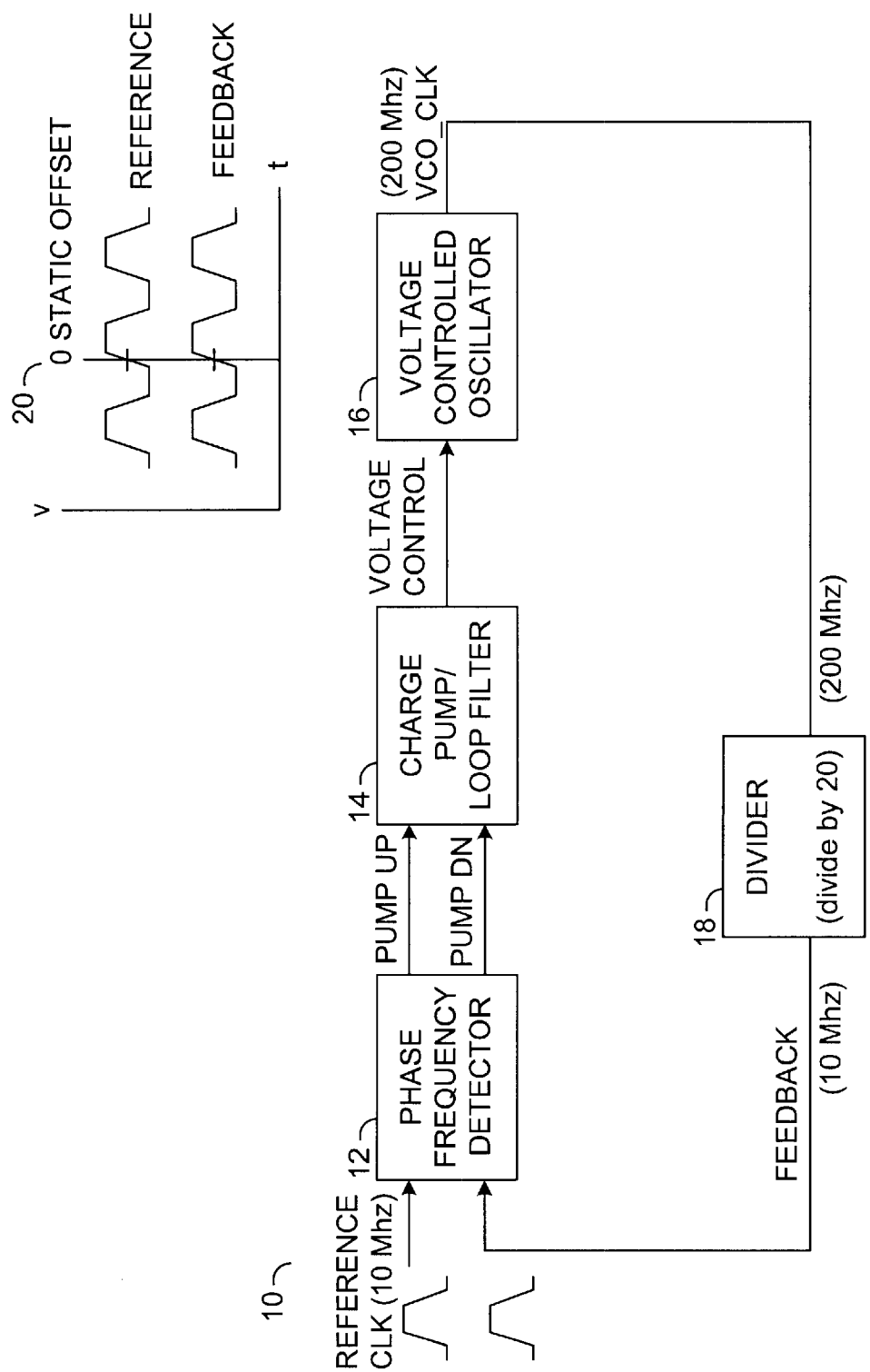
FIG. 1
(CONVENTIONAL)

CIRCUIT AND METHOD FOR PREVENTING RUNAWAY IN A PHASE LOCK LOOP

FIELD OF THE INVENTION

The present invention relates to phase lock loop circuits generally and, more particularly, to a circuit and method for preventing a runaway condition in a phase lock loop circuit.

BACKGROUND OF THE INVENTION

Voltage controlled oscillators (VCOs) are used in phase lock loops (PLLs) to generate clocks having particular frequencies. PLLs are generally considered clock multipliers. For example, an input reference clock having a frequency of 10 Mhz can be multiplied by the PLL to yield an output clock signal having a frequency of 100 Mhz. Ideally, this clock multiplication would result in an output clock which is in perfect phase/frequency with the reference clock. However, a condition generally referred to as VCO "runaway" is a condition that can occur when the output of the VCO is running at such high speed that the PLL (typically the counters in the PLL) are not capable of operating at a sufficient speed to keep up with the VCO output clock signal. This condition can (and does) occur during power up and initial lock acquisition.

Referring to FIG. 1, a circuit 10 illustrating a conventional phase lock loop circuit is shown. The circuit 10 generally comprises a phase frequency detector (PFD) 12, a loop filter 14, a voltage controlled oscillator (VCO) 16 and a divider 18. The VCO 16 presents a signal (i.e., VCO_CLK) to the divider 18. The divider 18 presents a feedback signal to the PFD 12. The PFD 12 also receives a reference clock (i.e., CLK). The difference in frequency between the reference clock CLK and the feedback signal is used to generate two control signals (i.e., PumpUP and PumpDN) that are presented to the loop filter 14. The loop filter 14 presents a voltage control signal to the VCO 16 in response to the control signals PumpUP and PumpDN. During normal operating conditions, the reference clock CLK is generally synchronized with the feedback signal. Such a synchronization is shown by the block 20.

An example of the runaway condition can be described using an example of an 200 Mhz PLL 10 having a divider implementing divide-by-20 feedback counters and an 10 Mhz reference clock CLK. When the PLL 10 is initially powered on, the control nodes (i.e., the input) of the VCO 16 are set to some arbitrary high voltage. In the example of a wide frequency range VCO 16, oscillations beyond a normal operating range could result. If the feedback counters of the divider 18 are designed to run at 200 Mhz or below (either due to current consumption or structural limitations) the output of the feedback counter 18 may be unpredictable. The divider 18 is likely to generate an output signal having a low frequency related to the underlying noise factors (perhaps in the 1 Mhz range). Since the reference clock CLK presented to the PFD 12 is set to 10 Mhz and the feedback signal is now oscillating at only 1 Mhz, the PFD 12 will generate predominately PumpUP control signals to the loop filter 14. As a result, a further increase in the control nodes to the VCO 16 will occur, which results in the VCO 16 presenting the output clock signal VCO_CLK running at an even faster frequency.

In addition, the runaway condition can occur in the VCO 16 when the output clock signal VCO_CLK has a frequency that increases to the point where the feedback counters of the divider 18 fail. Alternately, in a case where the feedback from the VCO 16 is derived outside of the chip, a high load can "kill" the frequency of the feedback signal presented to the PFD, which causes a sequence of PumpUP control signals to be presented to the VCO 16.

The ultimate effects of a VCO runaway condition are dramatic. When implemented in a typical PLL system (such as that shown in FIG. 1), a "lock-up" condition can occur which requires a hard reset to allow the VCO 16 to resume normal operation.

One conventional approach that may be used to reduce the effect of a VCO runaway condition may be to build a feedback divider 18 (and the associated counters and logic) that can always keep up with the operating frequency of the VCO 16. However, to prevent the runaway condition, such logic and counters can be required to run at very fast speeds, which can draw high amounts of current. Such a high speed, high current device may be impossible to implement if the VCO 16 is a CML derivative and the counters are implemented in CMOS technology. Additionally, such a solution continues to emphasize these drawbacks as operating frequencies continue to increase.

Another conventional approach is to place a voltage clamp on the control node (i.e., the input) of the VCO 16 that can track the process corners of the particular technology in which the PLL 10 is implemented. However, a voltage clamp that can function over a wide variety of process corners can be difficult to design. If the clamp does not track the process corners adequately, a lock-up condition can still occur. As the overall frequency of oscillation of the PLL 10 increases, the difficulty in designing a voltage clamp that tracks the process corners increases.

SUMMARY OF THE INVENTION

The present invention concerns a circuit and/or method comprising an oscillator circuit, a pulse detection circuit and a control circuit. The oscillator circuit may be configured to generate an output signal having a frequency in response to (i) a first control signal and (ii) a second control signal. The pulse detection circuit may be configured to generate a detect signal in response to the output signal. The control circuit may be configured to generate the second control signal in response to said detect signal.

The objects, features and advantages of the present invention include providing a circuit and method for preventing runaway in a phase lock loop that may (i) provide a more robust device, (ii) provide better reliability, (iii) require little added die area, (iv) save board level component cost, (v) save design time, and/or (vi) eliminate need for external components by allowing implementation on the same chip as the PLL.

BRIEF DESCRIPTION OF THE DRAWINGS

These and other objects, features and advantages of the present invention will be apparent from the following detailed description and the appended claims and drawings in which:

FIG. 1 is a block diagram illustrating a conventional phase lock loop;

DETAILED DESCRIPTION OF THE PREFERRED EMBODIMENTS

Figure 2:
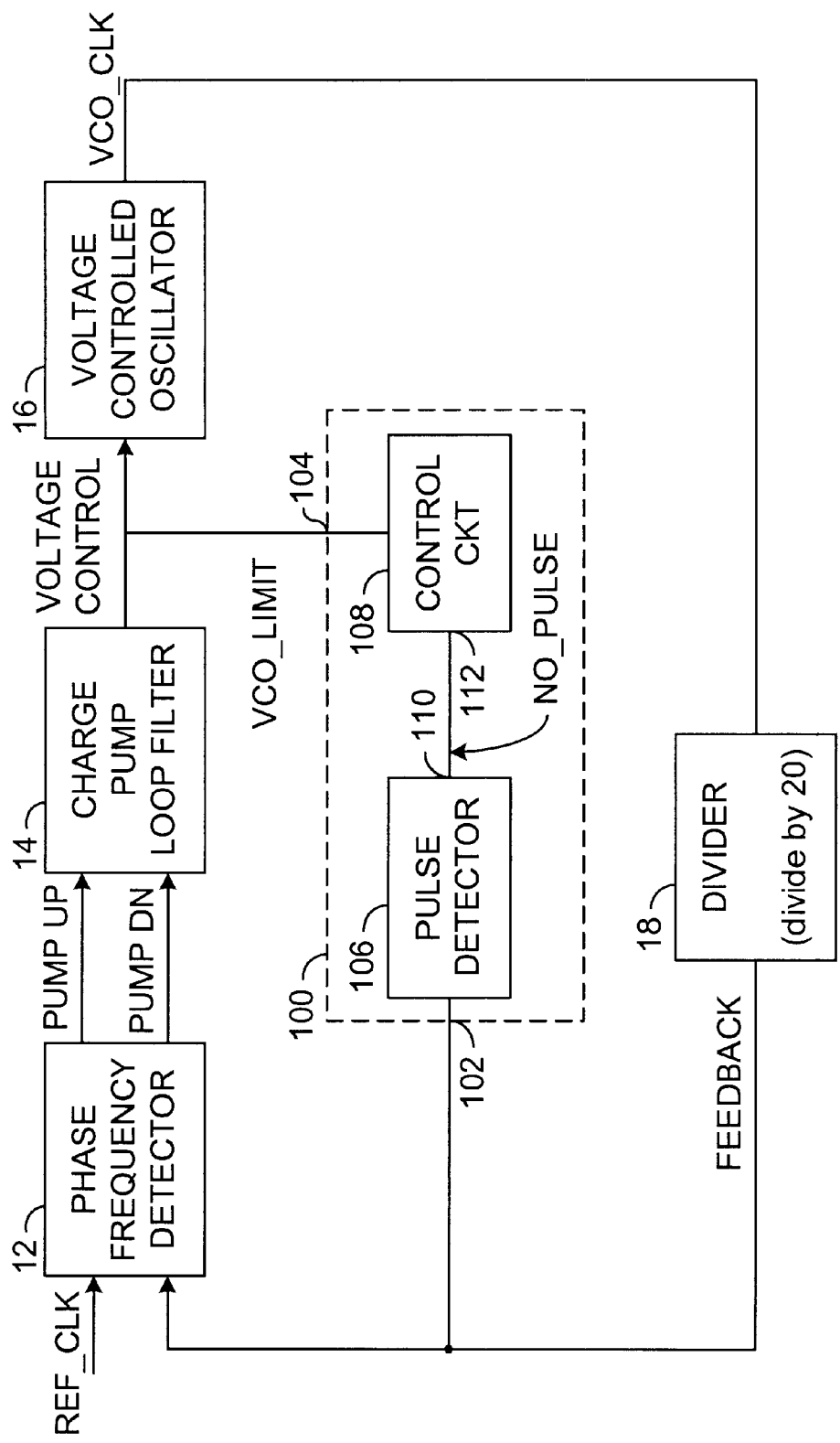
FIG. 2 is a block diagram illustrating a preferred embodiment of the present invention.

Referring to FIG. 2, a block diagram of a circuit 100 is shown in accordance with a preferred embodiment of the present invention. The circuit 100 is shown implemented in the context of a phase lock loop circuit, such as the PLL described in connection with FIG. 1. The circuit 100 may be implemented, in one example, as a voltage controlled oscillator (VCO) frequency limiter circuit. The circuit 100 may have an input 102 and an output 104. The input 102 may be configured to receive a feedback signal (e.g., FEEDBACK). The signal FEEDBACK may be generated by the divider 18 in response to an output signal (e.g., VCO_CLK) of the VCO 16. However, depending on the application, an input signal (e.g., REF_CLK) may be received from an output buffer, an input buffer, a reference clock, etc. In general, the input 102 may be connected to the output of the VCO 16 through the divider 18. The circuit 100 may be configured to generate a control signal (e.g., VCO_LIMIT) at the output 104 in response to the signal FEEDBACK. The signal VCO_LIMIT may be, in one example, a voltage control signal and/or a clamp signal.

The circuit 100 generally comprises a circuit 106 and a circuit 108. The circuit 106 may be implemented, in one example, as a pulse detector circuit. The circuit 108 may be implemented, in one example, as a control circuit. The circuit 106 may have an output 110. The circuit 106 may be configured to generate a detect signal (e.g., NO_PULSE) at the output 110 in response to the signal FEEDBACK. The signal NO_PULSE is generally presented to an input 112 of the circuit 108. The circuit 108 may be configured to generate the signal VCO_LIMIT in response to the signal NO_PULSE.

Figure 3:
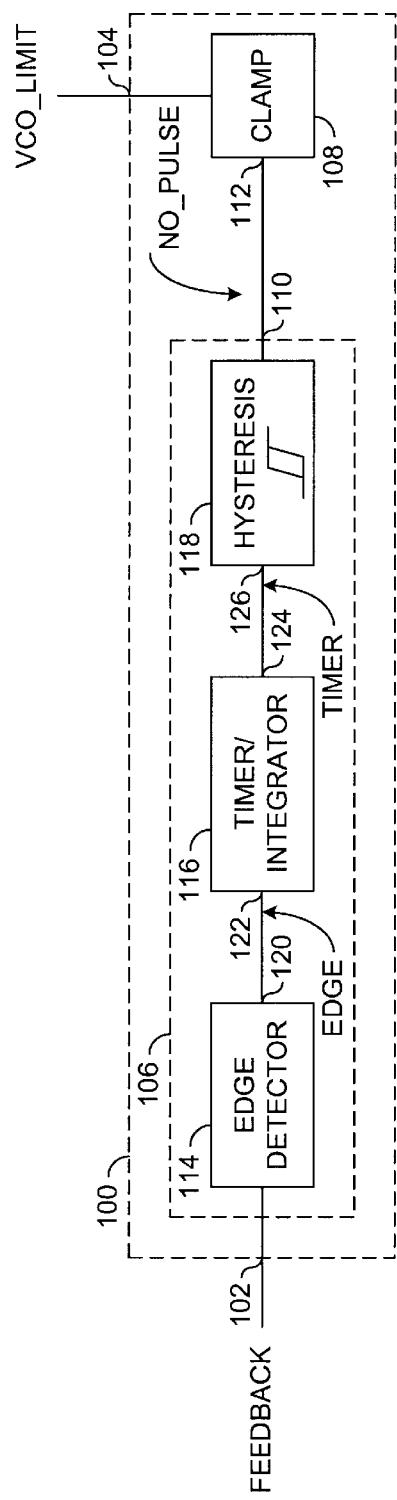
FIG. 3 is a more detailed block diagram illustrating a preferred embodiment of the present invention.

Referring to FIG. 3, a more detailed block diagram of the circuit 100 is shown. The circuit 106 generally comprises a circuit 114, a circuit 116, and a circuit 118. The circuit 114 may be implemented, in one example, as an edge detector circuit. The circuit 116 may be implemented, in one example, as timer/integrator circuit. The circuit 118 may be implemented, in one example, as a hysteresis circuit.

The circuit 114 may be configured to generate a detection signal (e.g., EDGE) at an output 120 in response to the signal FEEDBACK. The signal EDGE may be in a first state or a second state. The signal EDGE is generally in the first state when the signal FEEDBACK contains pulses with a pulse width greater than or substantially equal to a predetermined value. The signal EDGE is generally in the second state when the signal FEEDBACK includes no pulses or pulses with a pulse width less than the predetermined value.

The signal EDGE is generally presented to an input 122 of the circuit 116. The circuit 116 may be configured to generate an output signal (e.g., TIMER) at an output 124 in response to the signal EDGE. The signal TIMER may be voltage level signal. When the signal EDGE is in the first state, the signal TIMER is generally at or rising toward a supply voltage (e.g., VSUPPLY) at a predetermined rate. When the signal EDGE is in the second state, the signal TIMER is generally at or falling toward a ground potential (e.g., VSS) at a predetermined rate.

The signal TIMER is generally presented to an input 126 of the circuit 118. The circuit 118 may be configured to generate the signal NO_PULSE in response to the signal TIMER. The circuit 118 is generally configured to provide a predetermined amount of hysteresis between the signal NO_PULSE and the signal TIMER. When the signal TIMER reaches a first predetermine voltage level, the signal NO_PULSE generally switches from a first state to a second state. The signal NO_PULSE remains in the second state until the signal TIMER drops below a second predetermined voltage level. When the signal TIMER drops below the second predetermined voltage level, the signal NO_PULSE generally switches from the second state to the first state.

Figure 4:
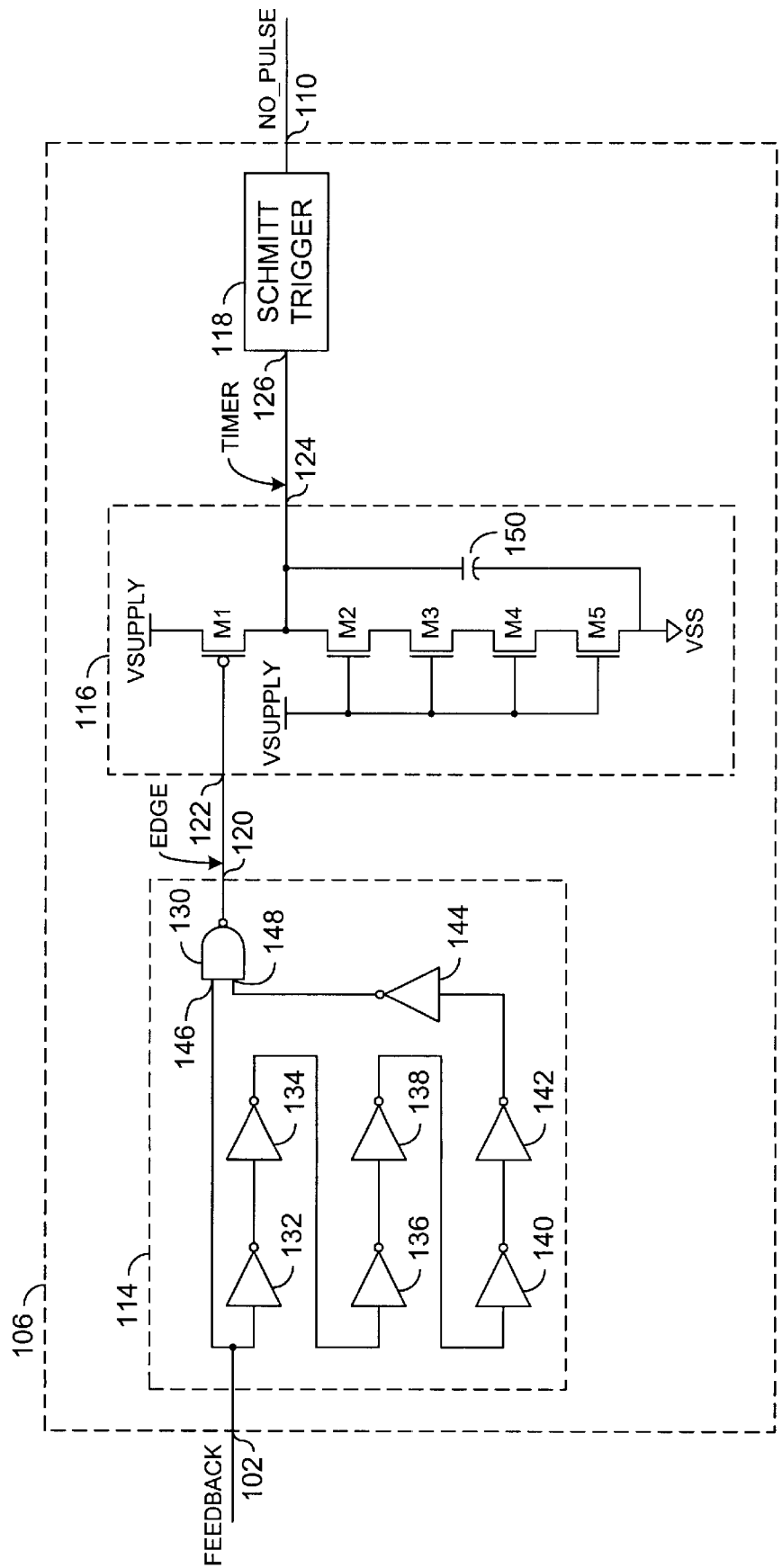
FIG. 4 is a schematic diagram illustrating an implementation of a pulse detector circuit of FIG. 2.

Referring to FIG. 4, a schematic diagram of an implementation of the circuit 102 is shown. The circuit 114 generally comprises, in one example, a gate 130, a gate 132, a gate 134, a gate 136, a gate 138, a gate 140, a gate 142, and a gate 144. The gate 130 may be implemented, in one example, as a two input NAND gate. The gates 132–144 may be implemented, in one example, as inverters. However, other types of gates may be implemented accordingly to meet the design criteria of a particular application. The signal FEEDBACK is generally presented to an input 146 of the gate 130 and an input of the gate 132. The gates 132–144 are generally connected in series (e.g., an output of the gate 132 is generally connected to an input of the gate 134; an output of the gate 134 is generally connected to an input of the gate 136; etc.). An output of the gate 144 is generally connected to an input 148 of the gate 130. The signal EDGE is generally presented at an output of the gate 130.

The circuit 116 generally comprises a transistor M1, a transistor M2, a transistor M3, a transistor M4, a transistor M5, and a capacitor 150. The transistor M1 may be implemented, in one example, as one or more PMOS field effect transistors. The transistors M2–M5 may be implemented, in one example, as one or more NMOS field effect transistors. However, other types and/or particular polarities of transistors may be implemented accordingly to meet the design criteria of a particular application. The capacitor 150 may have a first terminal, a second terminal, and a known capacitance value (e.g., C). Alternatively, the capacitor 150 may be implemented, in one example, as one or more transistors configured to operate as capacitors.

The signal EDGE is generally presented to a gate of the transistor M1. A source of the transistor M1 is generally connected to the supply voltage VSUPPLY. A drain of the transistor M1 is generally connected to (i) the output 124, (ii) a drain of the transistor M2, and (iii) the first terminal of the capacitor 150. A source of the transistor M2 is generally connected to a drain of the transistor M3. A source of the transistor M3 is generally connected to a drain of the transistor M4. A source of the transistor M4 is generally connected to a drain of the transistor M5. A source of the transistor M5 is generally connect to (i) the second terminal of the capacitor 150 and (ii) the ground potential VSS. A gate of the transistors M2, M3, M4, and M5 is generally connect to the supply voltage VSUPPLY. The signal TIMER is generally presented at the output 124. The circuit 118 may be implemented, in one example, as a Schmitt trigger circuit.

Figure 5:
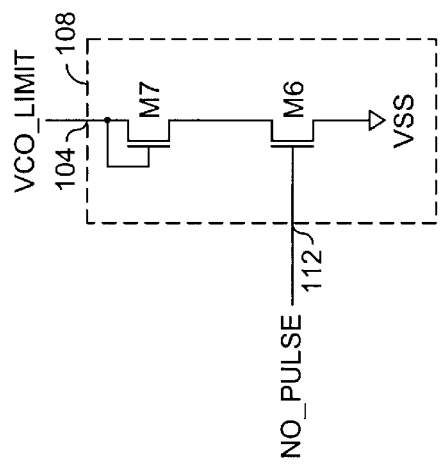
FIG. 5 is a schematic diagram illustrating a clamp circuit of FIG. 2.

Referring to FIG. 5, a schematic diagram of the circuit 108 is shown. The circuit 108 comprise a transistor M6 and a transistor M7. The transistors M6 and M7 may be implemented, in one example, as one or more NMOS field effect transistors. However, other types and/or polarities of transistors may be implemented accordingly to meet the design criteria of a particular application. In an alternative example, the transistor M7 may be implemented as a diode. The signal NO_PULSE may be presented to a gate of the transistor M6. A source of the transistor M6 is generally connected to the ground potential VSS. A drain of the transistor M6 may be connected to a source of the transistor M7. A gate of the transistor M7 may be connected to a drain of the transistor M7. The signal VCO_LIMIT may be presented at the drain of the transistor M7.

The signal FEEDBACK is generally presented to the circuit 114. The signal is generally propagated along a first pathway and a second pathway. The first pathway may be a direct connection to the gate 130. The second pathway may be an inverting delay line made up of a predetermined number of gates (e.g., the gates 132-144). The delay line may be used to ensure that pulses in the signal FEEDBACK have at least a predetermined pulse width. The predetermined pulse width may be set by adjusting the gate delay and/or the number of the gates in the delay line.

Figure 6:
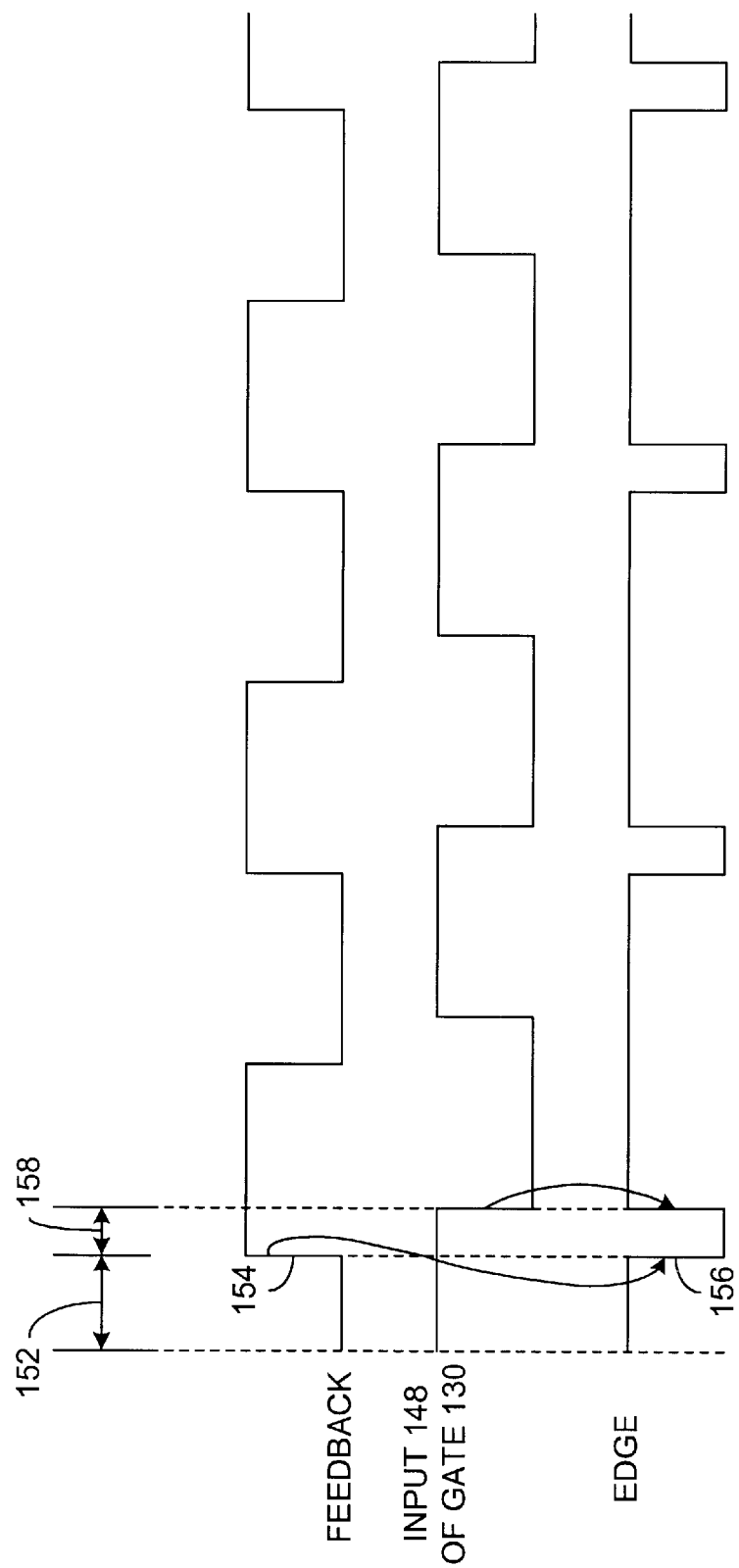
FIG. 6 is a timing diagram of the circuit of FIG. 4.

Referring to FIG. 6, a timing diagram illustrating various signals of the circuit 114 is shown. A portion 152 illustrates an example operation that when the signal FEEDBACK is in a first state (e.g., a logical "0", or LOW), the signal EDGE will generally be in a first state (e.g., a logical "1", or HIGH). When the signal FEEDBACK changes to a second state (e.g., a logical "1", or HIGH) at a transition 154, the signal EDGE will generally change to a second state (e.g., a logical "0", or LOW) at a transition 156 for a predetermined period of time set by the delay line (e.g., a portion 156). If the signal FEEDBACK returns to the first state before the predetermined period of time has ended, the signal EDGE will generally return to the first state. When the signal FEEDBACK contains pulses, the signal EDGE will generally be toggling between the HIGH and the LOW states. When the signal FEEDBACK contains no pulses, the signal EDGE will generally remain HIGH. The specific polarity of the signal EDGE and the signal FEEDBACK may be changed to meet the design criteria of a particular application.

The signal EDGE is generally presented to the circuit 116. When the signal EDGE is HIGH, the transistor M1 is generally shut OFF. When the transistor M1 is OFF, the transistors M2–M5 will generally pull the signal TIMER down to the ground potential VSS. When the signal TIMER is pulled down toward the ground potential VSS, the capacitor 150 generally becomes discharged. When the signal EDGE becomes LOW, the transistor M1 is generally turned ON. When the transistor M1 is turned ON, the capacitor 150 generally begins to charge. As the capacitor 150 charges, the voltage level of the signal TIMER generally begins to rise toward the supply voltage VSUPPLY. The rate at which the voltage level of the signal TIMER rises may be controlled by adjusting the capacitance value C of the capacitor 150 and/or the channel width/length (e.g., W/L) ratio of the transistor M1.

When the transistor M1 is OFF, the transistors M2–M5 may pull the signal TIMER toward the ground potential VSS. The rate at which the signal TIMER drops may be controlled by adjusting the W/L ratio of the transistors M2–M5. The W/L ratios of the transistors M2–M will generally be sufficiently smaller than the W/L ratio of the transistor M1 to minimize crowbar current and allow the signal TIMER to substantially reach the supply voltage VSUPPLY. In one example, The W/L ratio of the transistor M1 may be 28/1 while the W/L ratio of the transistors M2–M5 may be 3/25. However, other W/L ratios may be implemented accordingly to meet the design criteria of a particular implementation.

The signal TIMER is generally presented to the circuit 118. The circuit 118 may be configured to have a high threshold and a low threshold. When the voltage level of the signal TIMER is higher than the high threshold, the circuit 118 will generally present the signal NO PULSE in a first state. When the voltage level of the signal TIMER is below the low threshold, the circuit 118 will generally present the signal NO__PULSE in a second state. The signal NO__PULSE generally remains in a particular state until the voltage level of the signal TIMER crosses the corresponding threshold for the other state.

The signal NO__PULSE is generally presented to the circuit 104. When the signal NO__PULSE is in a first state, the signal VCO__LIMIT is generally clamped at a predetermined voltage level. The predetermined voltage level of the signal VCO__LIMIT sets the maximum frequency of the VCO 16. When the signal NO__PULSE is in a second state, the signal VCO__LIMIT is generally inactive and the PLL operates normally.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an oscillator circuit configured to generate an output signal having a frequency in response to (i) a first control signal generated in response to a reference signal and said output signal and (ii) a second control signal;
   a pulse detection circuit comprising an edge detector circuit, configured to generate a detect signal in response to said output signal by detecting edges in a feedback signal; and
   a control circuit configured to generate said second control signal in response to said detect signal by timing the spacing of said edges.

2. The apparatus according to claim 1, wherein said apparatus is part of a phase lock loop circuit.

3. An apparatus comprising:
   an oscillator circuit configured to generate an output signal having a frequency in response to (i) a first control signal and (ii) a second control signal;
   a pulse detection circuit comprising an integrator and a hysteresis circuit, configured to generate a detect signal in response to said output signal by detecting edges in a feedback signal; and
   a control circuit configured to generate said second control signal in response to said detect signal by timing the spacing of said edges.

4. The apparatus according to claim 3, wherein said hysteresis circuit comprises a schmitt trigger.

5. The apparatus according to claim 3, wherein said integrator circuit comprises a transistor, a resistor of known value, and a capacitor of known value.

6. The apparatus according to claim 5, wherein said resistor comprises one or more transistors.

7. The apparatus according to claim 1, wherein said oscillator circuit comprises a voltage controlled oscillator.

8. The apparatus according to claim 7, wherein said control circuit limits the maximum frequency of said voltage controlled oscillator.

9. The apparatus according to claim 1, wherein said detect signal is generated in response to a feedback signal from a feedback divider.

10. An apparatus comprising:
    means for generating an output signal having a frequency in response to (i) a first control signal generated in response to a reference signal and said output signal and (ii) a second control signal;
    means for generating a detect signal, comprising an edge detector circuit, in response to said output signal by detecting edges in a feedback signal; and
    means for generating said second control signal in response to said detect signal by timing the spacing of said edges.

11. A method of preventing a runaway condition in a phase lock loop comprising the steps of:
    (A) generating an output signal having a frequency in response to (i) a first control signal and (ii) a second control signal;
    (B) generating a detect signal in response to said output signal by (i) detecting edges in a feedback signal and (ii) timing the spacing of said edges; and
    (C) generating said second control signal in response to said detect signal.

12. The method according to claim 11, wherein said step of detecting edges in said feedback signal further comprises the sub-steps of:

(B-i-a) generating a time-delayed version of said feedback signal;

(B-i-b) comparing said time delayed version of said feedback signal to said input signal;

(B-i-c) if said time-delayed version of said feedback signal and said feedback signal are in a first predetermined state, generating an edge detect signal having a first logic state;

(B-i-d) if said time-delayed version of said feedback signal and said feedback signal are in a second predetermined state, generating said edge detect signal having a second logic state;

(B-i-e) if said time-delayed version of said feedback signal and said feedback signal are in different states, generating said edge detect signal having said second logic state.

13. The method according to claim 11, wherein said feedback signal is generated by a feedback divider in response to said output signal.

14. The method according to claim 11, further comprising a step of (d) limiting the frequency of said output signal in response to said second control signal.

* * * * *